United States Patent
Kim

(10) Patent No.: US 8,969,887 B2
(45) Date of Patent: Mar. 3, 2015

(54) LIGHT EMITTING DEVICE

(71) Applicant: Samsung Electronics Co., Ltd., Suwon-si, Gyeonggi-do (KR)

(72) Inventor: Yu Sik Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/889,143

(22) Filed: May 7, 2013

(65) Prior Publication Data

US 2013/0292710 A1    Nov. 7, 2013

(30) Foreign Application Priority Data

May 7, 2012    (KR) .................... 10-2012-0048047

(51) Int. Cl.
*H01L 33/50* (2010.01)
*H01L 33/00* (2010.01)
*H01L 33/38* (2010.01)

(52) U.S. Cl.
CPC ............ *H01L 33/50* (2013.01); *H01L 33/0095* (2013.01); *H01L 33/382* (2013.01); *H01L 33/505* (2013.01); *H01L 33/507* (2013.01); *H01L 2933/0041* (2013.01)
USPC ........................................................ 257/88

(58) Field of Classification Search
USPC ........................................................ 257/88
See application file for complete search history.

(56) References Cited

U.S. PATENT DOCUMENTS

| | | | |
|---|---|---|---|
| 7,071,618 B2* | 7/2006 | Ishikawa et al. | 313/509 |
| 7,626,331 B2* | 12/2009 | Lee et al. | 313/504 |
| 8,686,461 B2* | 4/2014 | Chu et al. | 257/99 |
| 2005/0151125 A1* | 7/2005 | Erchak et al. | 257/13 |
| 2006/0071228 A1* | 4/2006 | Sun | 257/99 |
| 2012/0161173 A1* | 6/2012 | Shen | 257/89 |
| 2013/0320297 A1* | 12/2013 | Erchak et al. | 257/13 |

FOREIGN PATENT DOCUMENTS

| | | |
|---|---|---|
| JP | 2009-134965 A | 6/2009 |
| KR | 10-0638868 B1 | 10/2006 |
| KR | 10-0894169 B1 | 4/2009 |
| KR | 2009-0078912 A | 7/2009 |
| KR | 10-1096639 B1 | 12/2011 |

* cited by examiner

*Primary Examiner* — Thao P Le
(74) *Attorney, Agent, or Firm* — McDermott Will & Emery LLP

(57) ABSTRACT

A light emitting device includes: a support substrate; at least one light emitting laminate having a structure in which semiconductor layers are laminated and formed on the support substrate; a wall unit formed on the support substrate and surrounding the at least one light emitting laminate; and a wavelength conversion layer disposed above the at least one light emitting laminate.

19 Claims, 25 Drawing Sheets

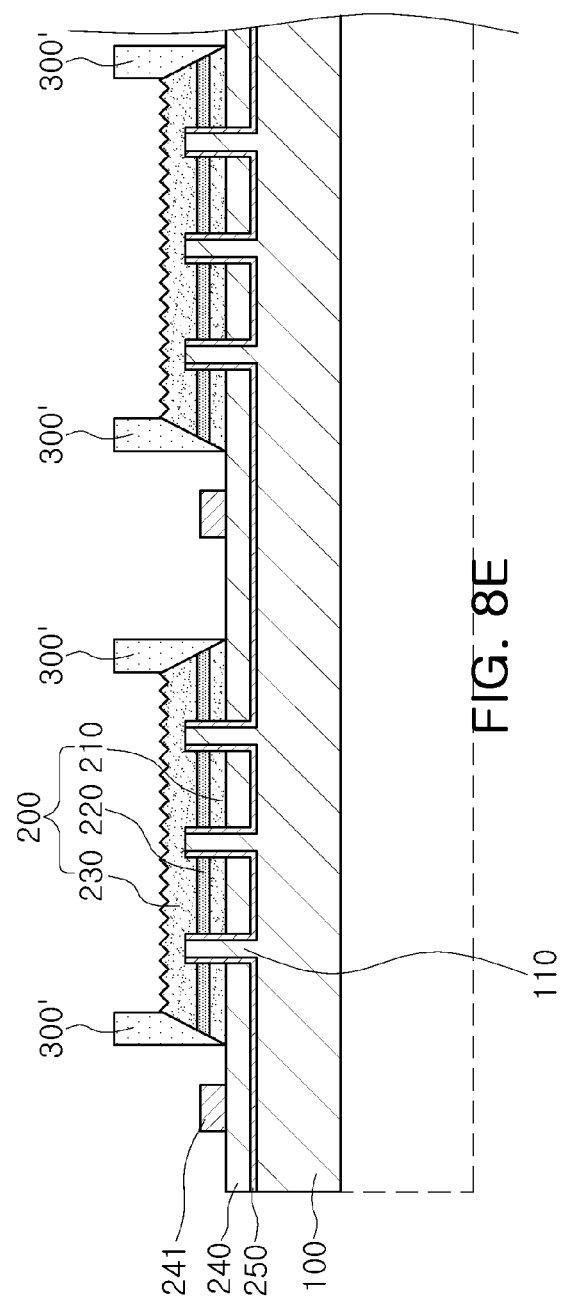

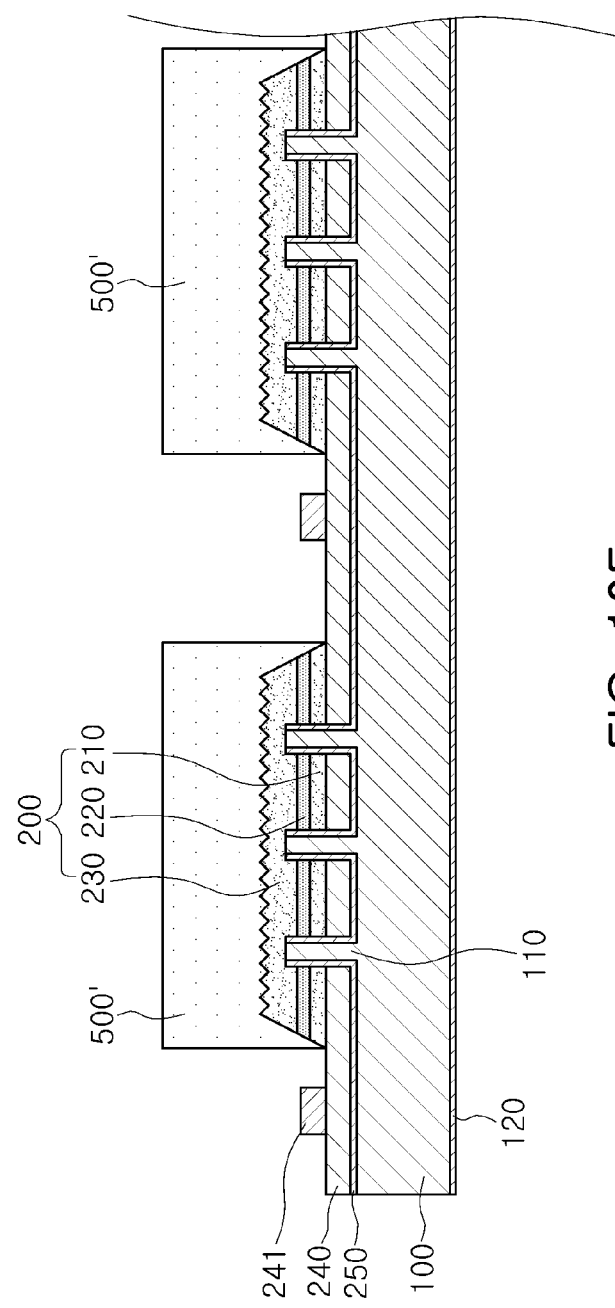

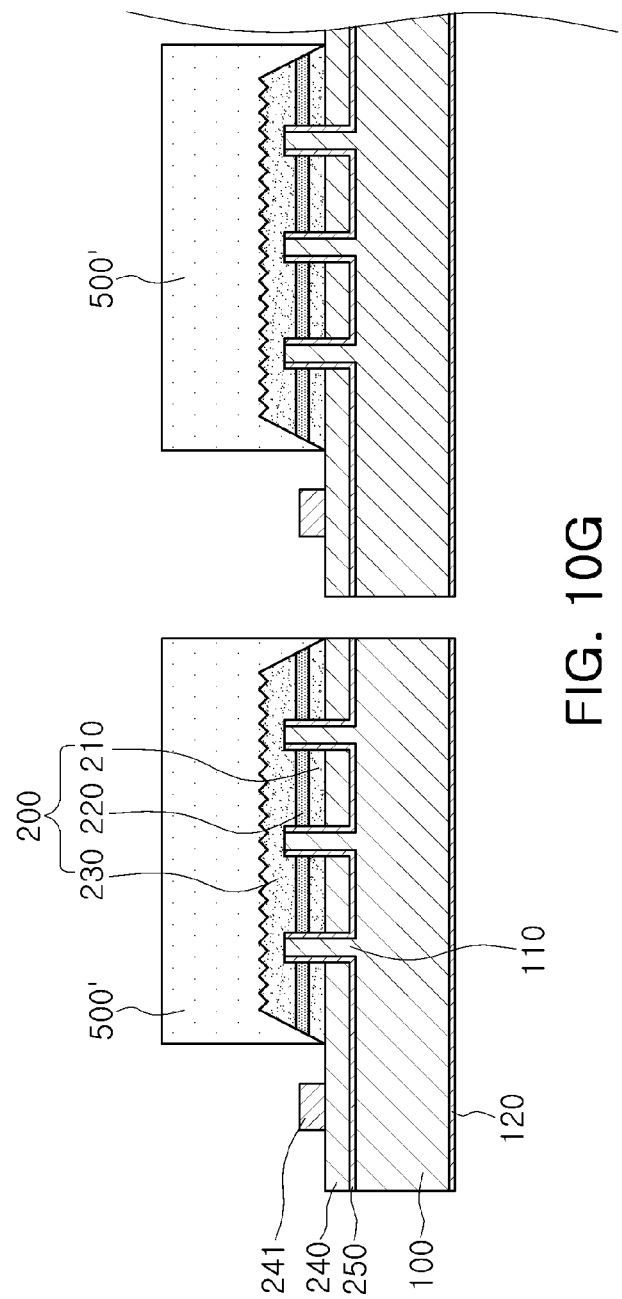

LIGHT EMITTING DEVICE

CROSS-REFERENCE TO RELATED APPLICATION

This application claims the priority of Korean Patent Application No. 10-2012-0048047 filed on May 7, 2012, in the Korean Intellectual Property Office, the disclosure of which is incorporated herein by reference in its entirety.

BACKGROUND OF THE DISCLOSURE

1. Field of the Disclosure
The present disclosure relates to a light emitting device.
2. Description of the Related Art
A light emitting diode (LED), a semiconductor device that converts electrical energy into optical energy, is a type of light emitting device made of a compound semiconductor material which emits light having a particular wavelength according to an energy band gap.

An application of light emitting devices has extended from optical communications and displays (e.g., a mobile device display or a computer monitor) and planar light sources such as a backlight unit (BLU) for an LCD, to general illumination devices. Development of a light emitting device for illumination requires a relatively high current, high quantity of light, and uniform light emitting characteristics (e.g., luminescence properties or emission characteristics), such that a novel design and manufacturing process needs to be developed in the field.

In a conventional pre-molded reflector-type light emitting device package structure, a light emitting device is mounted in a package main body having a reflector, and a resin unit is formed within the package main body to protect the light emitting device. In this case, in order to emit white light, phosphors for converting a wavelength of light emitted from the light emitting device may be distributed within the resin unit.

SUMMARY OF THE DISCLOSURE

There is a need in the art for a light emitting device having a reduced color distribution.

According to an aspect of the present disclosure, there is provided a light emitting device including: a support substrate; at least one light emitting laminate having a structure in which semiconductor layers are laminated and formed on the support substrate; a wall unit formed on the support substrate and surrounding the at least one light emitting laminate; and a wavelength conversion layer disposed above the at least one light emitting laminate.

The wall unit may be formed to be higher than the at least one light emitting laminate such that an upper surface of the wall unit is positioned higher than an upper surface of the at least one light emitting laminate.

The wall unit may be made of a metal formed through plating, and may be formed along a circumference of the at least one light emitting laminate.

The at least one light emitting laminate may include plural light emitting laminates, and the wall unit may be formed between mutually adjacent light emitting laminates such that the mutually adjacent light emitting laminates are disposed on both sides of the wall unit, and the mutually adjacent light emitting laminates may share the wall unit.

The at least one light emitting laminate may include plural light emitting laminates, and the wall unit surrounding any one side of one adjacent light emitting laminate may be spaced apart from a different wall unit surrounding another adjacent light emitting laminate by a certain interval, such that the wall unit is not connected to the different wall unit.

The at least one light emitting laminate may have a structure in which a first conductivity-type semiconductor layer, a second conductivity-type semiconductor layer, and an active layer interposed between the first and second conductivity-type semiconductor layers, are laminated, the light emitting device may further include an electrode pad formed on the support substrate and electrically connected to any one of the first and second conductivity-type semiconductor layers.

The electrode pad may be disposed outside of the wall unit formed along the circumference of the light emitting laminate to inwardly surround the light emitting laminate.

The electrode pad may not be covered by the wavelength conversion layer.

The wavelength conversion layer may have wavelength conversion characteristics adjusted to have color distribution minimized in consideration of light emitting characteristics of a corresponding light emitting laminate.

The wavelength conversion characteristics of the wavelength conversion layer may be adjusted by differentiating types of phosphors or the content of phosphors contained therein.

The wavelength conversion layer may be fixedly attached to the wall unit.

The support substrate may be made of a material having conductivity.

The light emitting device may further include a molding part disposed in the wall unit to cover the light emitting laminate.

According to another aspect of the present disclosure, there is provided a light emitting device including: a support substrate; a light emitting layer formed on the support substrate; and a conductive via extending from the support substrate through the light emitting layer.

Depressions and protrusions may be formed on an upper surface of the light emitting layer.

The light emitting layer may include a first conductivity-type semiconductor layer, a second conductivity-type semiconductor layer, and an active layer interposed between the first and second conductivity-type semiconductor layers.

The conductive via may extend through the light emitting layer so as to be electrically connected to one of the first and second conductivity-type semiconductor layers, and electrically isolated from the active layer and the other one of the first and second conductivity-type semiconductor layers.

A side surface of the light emitting layer may form an acute angle with a bottom surface of the light emitting layer.

A wall unit may be formed on the light emitting layer.

BRIEF DESCRIPTION OF THE DRAWINGS

The above and other aspects, features and advantages of the present disclosure will be more clearly understood from the following detailed description taken in conjunction with the accompanying drawings, in which:

FIGS. 8A through 8I are views schematically illustrating a sequential process of a method for manufacturing the light emitting device of FIG. 7 according to another exemplary embodiment of the present disclosure;

FIGS. 10A through 10I are views schematically illustrating a sequential process of a method for manufacturing the light emitting device of FIG. 9 according to another exemplary embodiment of the present disclosure.

DETAILED DESCRIPTION OF PREFERRED EMBODIMENTS

Figure 1:
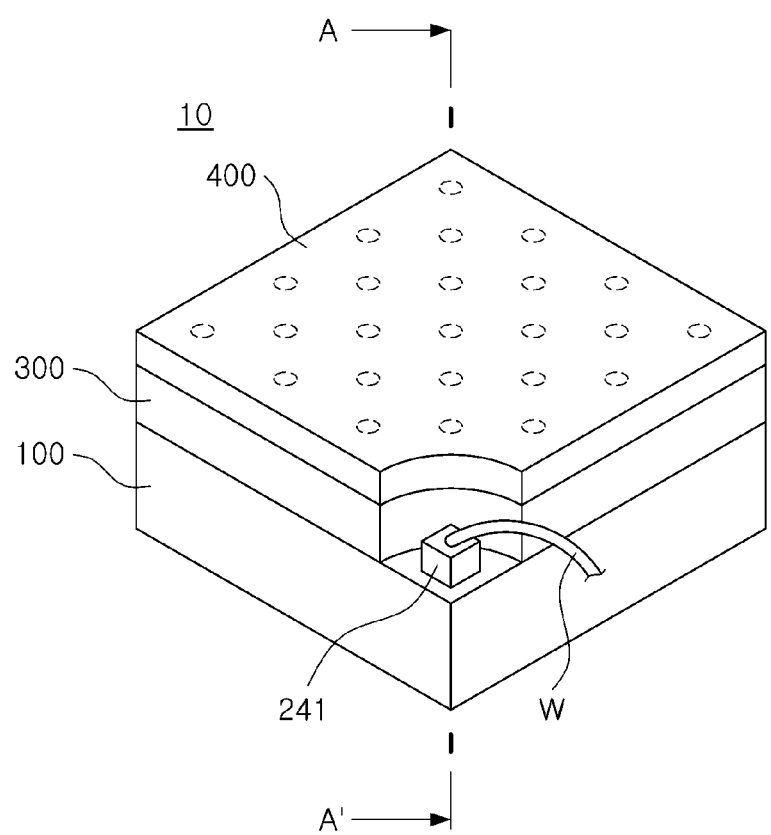
FIG. 1 is a perspective view schematically illustrating a light emitting device according to an exemplary embodiment of the present disclosure.

Exemplary embodiments of the present disclosure will now be described in detail with reference to the accompanying drawings.

The present disclosure may, however, be embodied in many different forms and should not be construed as being limited to the exemplary embodiments set forth herein.

Rather, these embodiments are provided so that this disclosure will be thorough and complete, and will fully convey examples within the scope of the disclosure to those having ordinary skill in the art.

In the drawings, the shapes and dimensions of elements may be exaggerated for clarity, and the same reference numerals will be used throughout to designate the same or like components.

Figure 2:
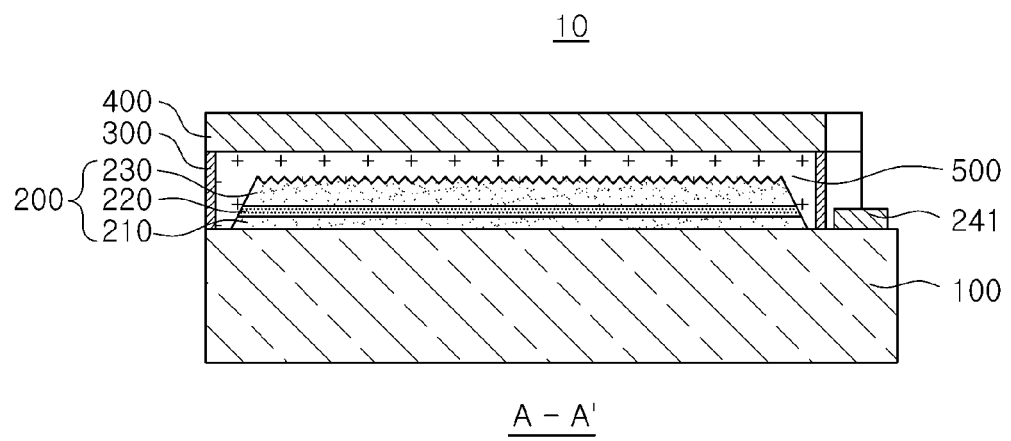
FIG. 2 is a cross-sectional view of the light emitting device of FIG. 1.
Figure 3:
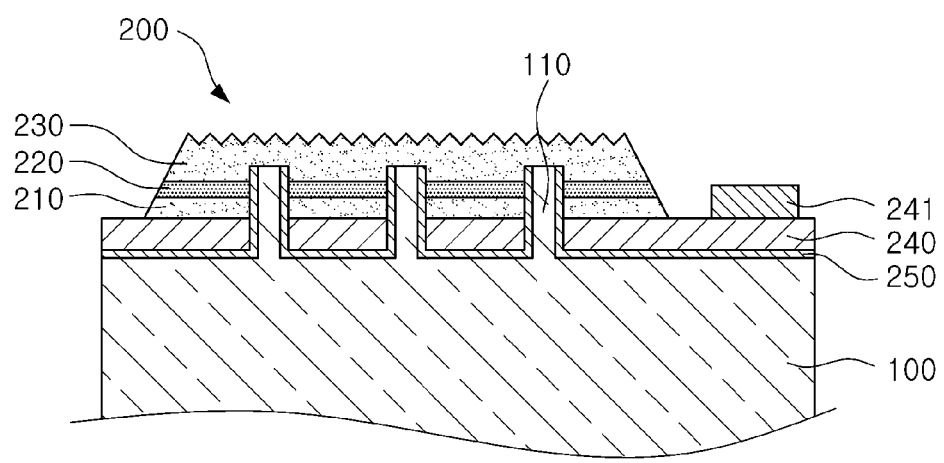
FIG. 3 is a cross-sectional view schematically illustrating a light emitting laminate of the light emitting device of FIG. 1.
Figure 4:
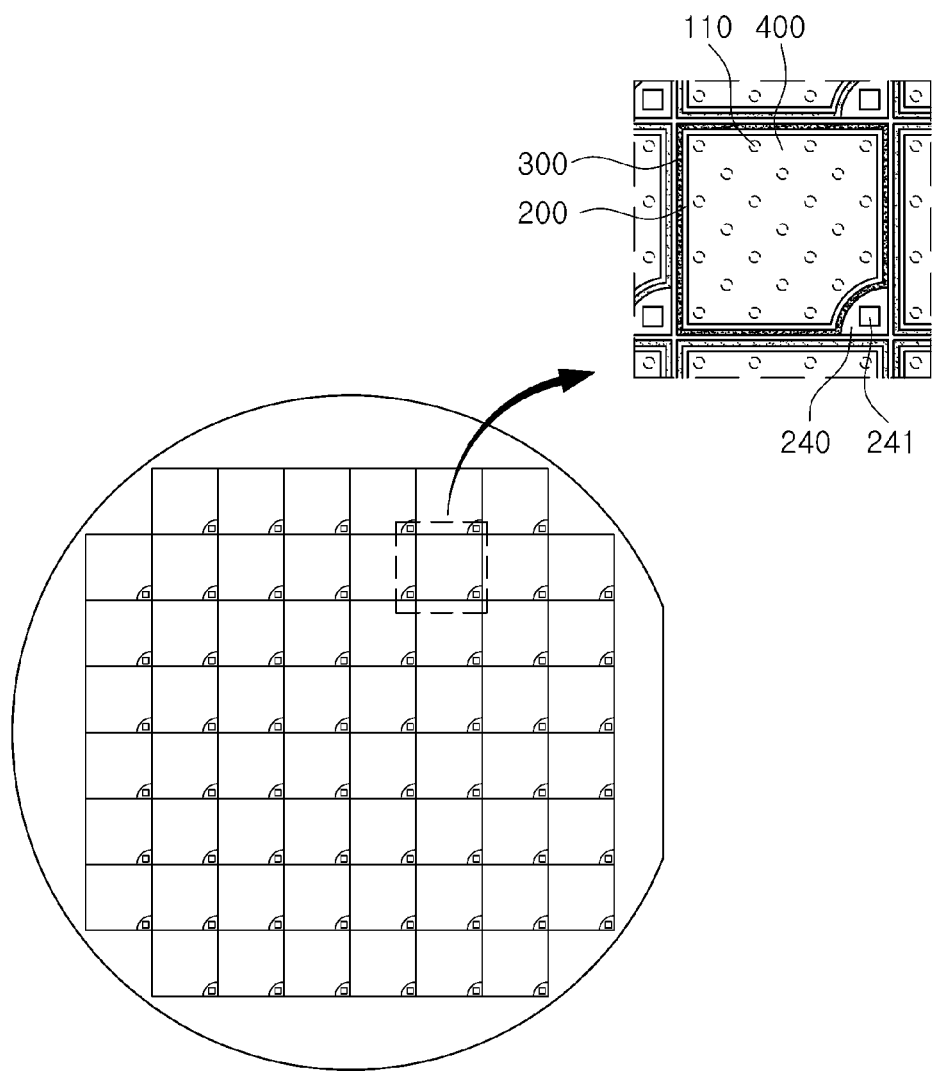
FIG. 4 is a plan view schematically illustrating a state in which light emitting devices of FIG. 1 are arranged on a support substrate.
Figure 5:
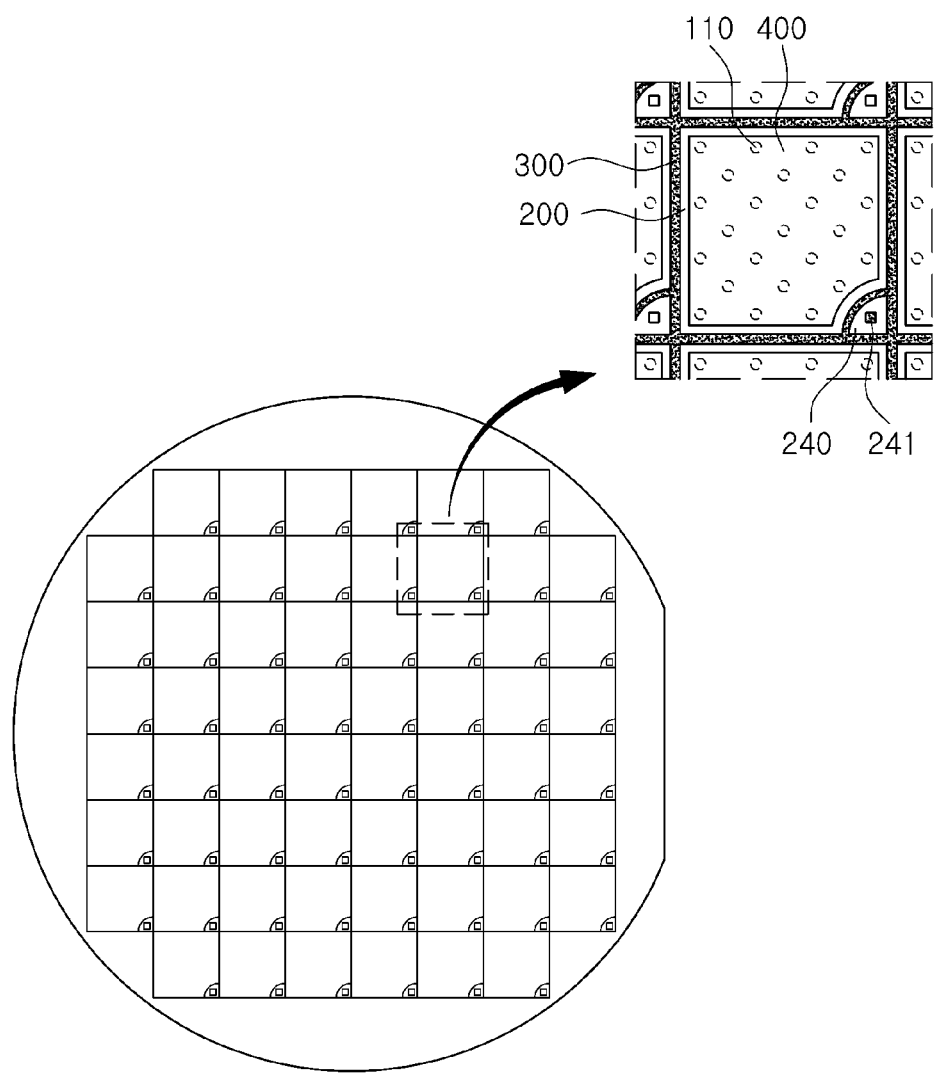
FIG. 5 is a plan view schematically illustrating another state in which light emitting devices of FIG. 1 are arranged on a support substrate.
Figure 6:
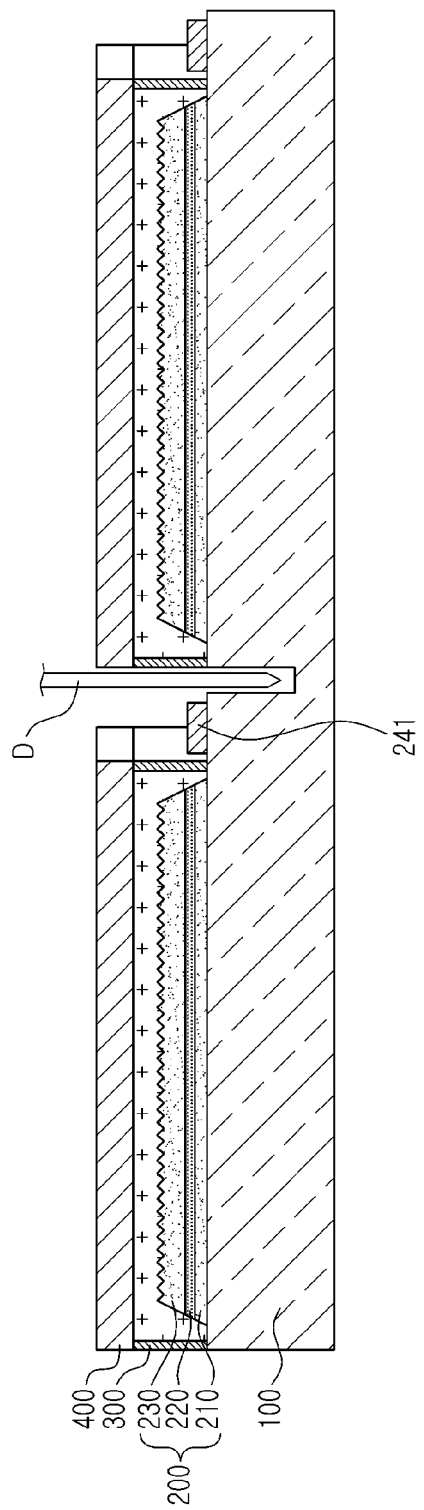
FIG. 6 is a view schematically illustrating singulation (or cutting) of a light emitting device of FIG. 4.

A light emitting device according to an exemplary embodiment of the present disclosure will be described with reference to FIGS. 1 through 6. FIG. 1 is a perspective view schematically illustrating a light emitting device according to an exemplary embodiment of the present disclosure. FIG. 2 is a cross-sectional view of the light emitting device of FIG. 1. FIG. 3 is a cross-sectional view schematically illustrating a light emitting laminate of the light emitting device of FIG. 1. FIG. 4 is a plan view schematically illustrating a state in which light emitting devices of FIG. 1 are arranged on a support substrate. FIG. 5 is a plan view schematically illustrating another state in which light emitting devices of FIG. 1 are arranged on a support substrate. FIG. 6 is a view schematically illustrating singulation (or cutting) of a light emitting device of FIG. 4.

With reference to FIGS. 1 and 2, a light emitting device 10 according to an exemplary embodiment of the present disclosure may include a support substrate 100, a light emitting laminate 200, a wall unit 300, and a wavelength conversion layer 400.

The support substrate 100, which serves as a support (or a prop) for the light emitting laminate 200 formed thereon, may be made of a material including at least one of gold (Au), nickel (Ni), aluminum (Al), copper (Cu), tungsten (W), silicon (Si), selenium (Se) and gallium arsenide (GaAs). For example, the support substrate 100 may be made of copper (Cu) or Si—Al (a combination of Si and Al) having conductivity. In this case, the support substrate 100 may be formed using, for example, a plating or bonding method.

The light emitting laminate 200 may have a structure in which a plurality of semiconductor layers are laminated. A plurality of light emitting laminates may be formed on the support substrate 100. In this case, the plurality of light emitting laminates 200 may be spaced apart from one another by certain intervals in horizontal and vertical directions so as to be arranged in a matrix form.

The light emitting laminate 200 may include a first conductivity-type semiconductor layer 210, an active layer 220, and a second conductivity-type semiconductor layer 230 sequentially grown on the support substrate 100. The first conductivity-type semiconductor layer 210 may be an n-type nitride semiconductor layer and the second conductivity-type semiconductor layer 230 may be a p-type nitride semiconductor layer, or vice versa.

The first and second conductivity-type semiconductor layers 210 and 230 may have an empirical formula of $Al_xIn_yGa_{(1-x-y)}N$ (e.g., $0 \leq x \leq 1$, $0 \leq y \leq 1$, $0 \leq x+y \leq 1$) corresponding to materials such as, for example, GaN, AlGaN, InGaN, AlInGaN, and the like. The active layer 220 formed between the first and second conductivity-type semiconductor layers 210 and 230 emits light having a certain level of energy according to electron—hole recombination, and may have a multi-quantum well (MQW) structure in which quantum well layers and quantum barrier layers are alternately laminated. Here, the MQW structure may be, for example, an InGaN/GaN structure.

One of the semiconductor layers of the light emitting laminate 200 may be electrically connected to the support substrate 100 and the other may be electrically connected to an electrode pad 241 formed on the support substrate 100. In this case, an insulator may be interposed between the electrode pad 241 and the support substrate 100 in order to electrically insulate the electrode pad 241 from the support substrate 100.

In detail, as illustrated in FIG. 3, a conductive contact layer 240 may be formed on the support substrate 100 as a conductive substrate, and the light emitting laminate 200, namely, a laminated structure including the first conductivity-type semiconductor layer 210, the active layer 220, and the second conductivity-type semiconductor layer 230, may be formed on the conductive contact layer 240. The conductive contact layer 240 may be electrically separated from the support substrate 100, and to this end, an insulator 250 may be interposed between the conductive contact layer 240 and the support substrate 100.

The conductive contact layer 240 may serve to reflect light emitted from the active layer 220 toward an upper portion of the light emitting device, e.g., toward the second conductivity-type semiconductor layer 230, and may form an ohmic-contact with the first conductivity-type semiconductor layer 210. In consideration of this function, the conductive contact layer 240 may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, or a combination of such materials. In this case, although not shown in detail, the conductive contact layer 240 may have a structure including two or more layers to enhance reflective efficiency. For example, the structure may include Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. In the present exemplary embodiment, a portion of the conductive contact layer 240 may be exposed to the outside, and as illustrated in FIG. 3, the exposed portion may be a region in which the light emitting laminate 200 is not formed. The exposed region of the conductive contact layer 240 corresponds to an electrical connection portion for applying an electrical signal, and the electrode pad 241 may be formed thereon. Namely, the electrode pad 241 is electrically connected to the conductive contact layer 240 to apply an electrical signal to the first conductivity-type semiconductor layer 210. The electrode pad 241 is electrically insulated from the support substrate 100 by the insulator 250 interposed between the conductive contact layer 240 and the support substrate 100. In the present exemplary embodiment, the electrode pad 241 is illustrated as separated from the light emitting laminate 200 and formed at a corner of the light emitting device 10 in the vicinity of one side of the light emitting laminate 200, but the present disclosure is not limited thereto whereby the position of the electrode pad 241 may be variably modified.

In the present exemplary embodiment, the conductive support substrate 100 is electrically connected to the second conductivity-type semiconductor layer 230, and accordingly, an electrical signal may be applied to the second conductivity-type semiconductor layer 230 through the support substrate 100. For this purpose, a conductive via 110 may be used which extends from the support substrate 100 to the second conductivity-type semiconductor layer 230 so as to be electrically connected thereto.

The conductive via 110 may be connected to the second conductivity-type semiconductor layer 230 within the second conductivity-type semiconductor layer 230. The number, shape and pitch of the conductive via 110, and a contact area of the conductive via 110 with the second conductivity-type semiconductor layer 230, and the like, may be appropriately adjusted in order to lower contact resistance. In this case, the conductive via 110 may be electrically separated from the active layer 220, the first conductivity-type semiconductor layer 210, and the conductive contact layer 240, by the insulator 250 formed therebetween. Any material may be employed as the insulator 250 so long as the material has electrical insulation properties. In addition, it is desirable for the insulator 250 to absorb as little light as possible, so, for example, a silicon oxide or a silicon nitride such as $SiO_2$, $SiO_xN_y$, $Si_xN_y$, or the like, may be used as suitable materials for the insulator 250.

As described above, in the present exemplary embodiment, the support substrate 100 is connected to the second conductivity-type semiconductor layer 230 by the conductive via 110, so that there is no need to form an additional electrode on an upper surface of the second conductivity-type semiconductor layer 230. Thus, the quantity of light emitted from the upper surface of the second conductivity-type semiconductor layer 230 can be increased. In this case, although the light emitting region may be reduced due to the presence of the conductive vias 110 formed at portions of the active layer 220, the effect of enhancing light extraction efficiency that can be obtained by omitting formation of an electrode on the upper surface of the second conductivity-type semiconductor layer 230 can be rather great. Meanwhile, in the semiconductor light emitting device 10, since an electrode disposed on the upper surface of the second conductivity-type semiconductor layer 230 is not necessary, the overall electrode disposition can be considered similar to a horizontal electrode structure, while a sufficient current spreading effect can be assured by the presence of the conductive vias 110 formed within the second conductivity-type semiconductor layer 230.

Meanwhile, as illustrated in FIG. 3, a lateral side of the light emitting laminate 200 may be sloped with respect to the conductive contact layer 240. For example, the light emitting laminate 200 may be sloped upwardly from an upper surface of the conductive contact layer 240. In this way, a side surface of the light emitting laminate 200 can form, e.g., an acute angle with the upper surface of the conductive contact layer 240. Such a sloped configuration may be naturally formed through a process of etching the light emitting laminate 200 to expose the conductive contact layer 240. Depressions and protrusions may be formed on an upper surface of the light emitting laminate 200, namely, on an upper surface of the second conductivity-type semiconductor layer 230. Such depressions and protrusions may be formed through an etching process such as laser irradiation, dry etching, wet etching, or the like. Preferably, a depression-and-protrusion structure having an irregular size, shape, and/or period is formed by using wet etching. Through such a structure, the probability of emitting light made incident from the active layer 220 to the outside can be increased.

The wall unit 300 may be formed on the support substrate 100 such that it surrounds the circumference of each of the plurality of light emitting laminates 200. The wall unit 300 is formed to be higher than the light emitting laminate 200, and thus, an upper surface of the wall unit 300 is positioned to be higher than that of the light emitting laminate 200. Accordingly, light emitted from the lateral side of the light emitting laminate 200 may be reflected by the wall unit 300, preventing light leakage from the lateral side.

The wall unit 300 may be formed by plating a metal such as silver (Ag), aluminum (Al), nickel (Ni), or the like. As the plating method, an electroplating method or an electroless plating method may be used. Although in the present exemplary embodiment the wall unit 300 may be formed through plating, the present disclosure is not limited thereto.

As illustrated in FIG. 4, the wall unit 300 surrounding any one side of an adjacent light emitting laminate 200 may be spaced apart from a different wall unit 300 surrounding a different adjacent light emitting laminate 200 by a certain interval. Namely, the mutually adjacent wall units 300 are not connected. In this case, as illustrated in FIG. 6, the wall units 300 are spaced apart by an interval greater than a thickness of a dicing blade D so that the dicing blade D does not come into contact with the wall unit 300 when cutting (or singulating) the respective light emitting laminates 200 into individual light emitting devices.

Alternatively, as illustrated in FIG. 5, a wall unit 300 may be formed between mutually adjacent light emitting laminates 200. Namely, mutually adjacent light emitting laminates 200 may be disposed on both sides of the wall unit 300. Thus, the mutually adjacent light emitting laminates 200 may share the wall unit 300 therebetween. When the mutually adjacent light emitting laminates 200 are cut into individual light emitting devices with the dicing blade D, the wall unit 300 may be separated to surround the respective light emitting laminates 200 as shown in FIG. 4.

The wall unit 300 may be formed along the circumference of the light emitting laminate 200, excluding the electrode pad 241, on the support substrate 100. Thus, the wall unit 300 accommodates the light emitting laminate 200 therein, while the electrode pad 241 formed on the support substrate 100 is disposed outside of the wall unit 300. Namely, the wall unit 300 is only formed along the circumference of the light emitting laminate 200, so that light emitted from the lateral side of the light emitting laminate 200 can be wholly reflected from the wall unit 300. Also, since the wall unit 300 serves to protect the light emitting laminate 200, electrical reliability of the device can be enhanced. For example, if the active layer 220 is exposed, it may act as a current leakage path during operation of the light emitting device. In the present exemplary embodiment, the active layer 220 may be prevented from being exposed by surrounding the circumference of the light emitting laminate 200 with the wall unit 300.

A molding part 500 may be formed to cover the light emitting laminate 200 within the wall unit 300. The molding part 500 may be made of a transparent resin having electrical insulation properties, and can hermetically seal an exposed portion of the light emitting laminate 200 to prevent a possibility of generating current leakage.

The molding part 500 may contain a light diffusing agent to enhance light extraction efficiency. The light diffusing agent may include one or more selected from the group consisting of $SiO_2$, $TiO_2$, and $Al_2O_3$.

A wavelength conversion layer 400 may be disposed on respective upper portions of a plurality of light emitting laminates 200. For example, the wavelength conversion layers 400 may be fixedly attached to corresponding wall units 300 and not disposed on upper portions of the electrode pads 241 disposed outside of the wall units 300, and thus, the electrode pads 241 are not covered by the wavelength conversion layers 400. Accordingly, without being interfered with by the wavelength conversion layer 400, the electrode pads 241 may be bonded to wires W to be electrically connected to an external power surface, e.g., a lead frame or the like, on which the light emitting device 10 is to be mounted.

The wavelength conversion layer 400 serves to convert a wavelength of light emitted from the light emitting laminate 200, and to this end, a structure in which at least one kind of phosphor is dispersed in a transparent resin may be used. Light converted by the wavelength conversion layer 400 may be mixed with light emitted from the light emitting laminate 200 to implement white light. For example, when the light emitting laminate 200 emits blue light, a yellow phosphor may be used; and when the light emitting laminate 200 emits ultraviolet light, red, green, and blue phosphors may be mixedly used. The colors of the phosphors and the light emitting laminate 200 may be variably combined to emit white light. Also, wavelength conversion materials for different colors such as green, red, and the like, may be applied to implement a light source for emitting relevant colors (i.e., other than white light).

For example, when blue light is emitted from the light emitting laminate 200, the red phosphor used therewith may include a $MAlSiNx:Re$ ($1 \leq x \leq 5$) nitride phosphor, an MD:Re sulfide phosphor, and the like. Here, M may be at least one selected from among Ba, Sr, Ca, and Mg, and D may be at least one selected from among S, Se, and Te, while Re may be at least one selected from among Eu, Y, La, Ce, Nd, Pm, Sm, Gd, Tb, Dy, Ho, Er, Tm, Yb, Lu, F, Cl, Br, and I. The green phosphor used therewith may include an $M_2SiO_4:Re$ silicate phosphor, an $MA_2D_4:Re$ sulfide phosphor, a $\beta$-SiAlON:Re phosphor, and an $MA'_2O_4:Re'$ oxide-based phosphor, and the like. Here, M may be at least one selected from among Ba, Sr, Ca, and Mg, A may be at least one selected from among Ga, Al, and In, D may be at least one selected from among S, Se, and Te, A' may be at least one selected from among Sc, Y, Gd, La, Lu, Al, and In, Re may be at least one selected from among Eu, Y, La, Ce, Nd, Pm, Sm, Gd, Tb, Dy, Ho, Er, Tm, Yb, Lu, F, Cl, Br, and I, and Re' may be at least one selected from among Ce, Nd, Pm, Sm, Tb, Dy, Ho, Er, Tm, Yb, F, Cl, Br, and I.

The wavelength conversion layer 400 may include quantum dots in place of the phosphors or provided with the phosphors. A quantum dot is a nano-crystal particle including a core and a shell, and the core size thereof ranges from 2 nm to 100 nm. By adjusting the core size, the quantum dot may be used as phosphors emitting various colors such as blue (B), yellow (Y), green (G), and red (R). At least two types of semiconductors among group II-VI compound semiconductors (e.g., ZnS, ZnSe, ZnTe, CdS, CdSe, CdTe, HgS, HgSe, HgTe, MgTe, etc.), group III-V compound semiconductors (e.g., GaN, GaP, GaAs, GaSb, InN, InP, InAs, InSb, AlAs, AlP, AlSb, AlS, etc.), or a group IV semiconductor (Ge, Si, Pb, etc.) may be hetero-joined to form a core and shell structure constituting a quantum dot. In this case, in order to terminate molecular binding on a surface of the shell of the quantum dot at an outer edge of the shell, in order to restrain cohesion of quantum dots to improve the dispersibility of a resin such as silicon resin, epoxy resin, or the like, or in order to improve the phosphor function, an organic ligand, using a material such as oleic acid, may be formed. The quantum dot is vulnerable to moisture or air, and in particular, when the quantum dot is in contact with a lead frame (not shown) of a package or an electrode pattern (not shown) of the substrate of an illumination device, or the like, in which the light emitting device according to the present disclosure is to be mounted, a chemical reaction may take place. Thus, as illustrated in the drawings, the wavelength conversion layer 400 may be applied on only the upper surface of the light emitting laminate 200, thereby eliminating the possibility of contact with the electrode pad or the support substrate, to thus enhance reliability thereof. Although the phosphors are taken as an example of the wavelength conversion material, the phosphors can be replaced with quantum dots, or quantum dots may be added to the phosphors.

The wavelength conversion layer 400 may have wavelength conversion characteristics adjusted such that color distribution is minimized in consideration of light emitting characteristics (e.g., luminescence properties or emission characteristics) of a corresponding light emitting laminate 200. The wavelength conversion characteristics of each wavelength conversion layer 400 may be adjusted by differentiating the types of phosphors or differentiating the content of the phosphors contained in each wavelength conversion layer 400, or the like.

In this manner, by selectively using an appropriate wavelength conversion layer 400 according to the characteristics of each light emitting laminate 200, color distribution can be adjusted to the MacAdam variance ellipse 3 step level.

Figure 7:
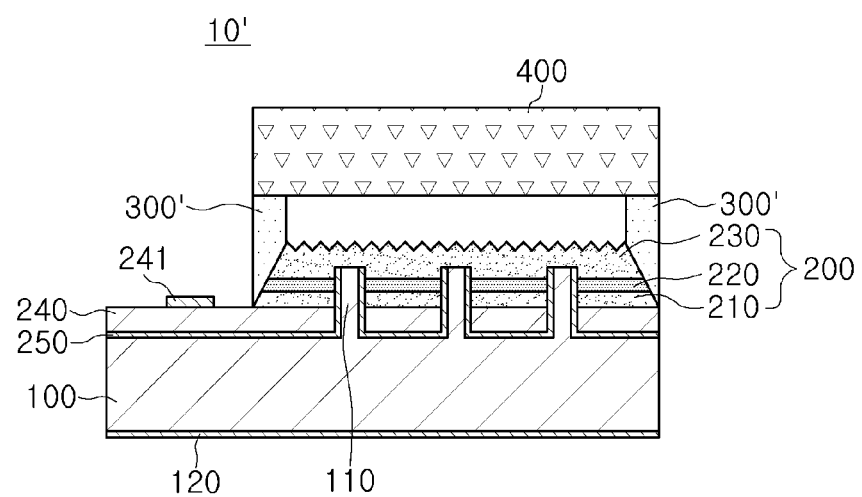
FIG. 7 is a cross-sectional view schematically illustrating a light emitting device according to another exemplary embodiment of the present disclosure.

FIG. 7 illustrates a light emitting device according to another exemplary embodiment of the present disclosure. Components constituting the light emitting device and a basic structure thereof according to the exemplary embodiment illustrated in FIG. 7 are substantially similar to those of the exemplary embodiment illustrated in FIGS. 1 and 2, except for the structure of the wall unit. Thus, descriptions of the same components and structure as those of the foregoing embodiment will be omitted and a variation of the wall unit will mainly be described.

FIG. 7 is a cross-sectional view schematically illustrating a light emitting device according to another exemplary embodiment of the present disclosure. Referring to FIG. 7, a light emitting device 10' may include the support substrate 100, the light emitting laminate 200, a wall unit 300', and the wavelength conversion layer 400.

The support substrate 100, which serves as a support (or a prop) for the light emitting laminate 200 formed thereon, may be made of, for example, a material including at least one selected from the group consisting of gold (Au), nickel (Ni), aluminum (Al), copper (Cu), tungsten (W), silicon (Si), selenium (Se) and gallium arsenide (GaAs). For example, a support substrate 100 having conductivity may be made of copper (Cu) or silicon-aluminum (Si—Al) (i.e., a combination of silicon (Si) and aluminum (Al)).

A metal layer 120 may be disposed on a lower surface of the support substrate 100 and electrically connected to the support substrate 100.

The light emitting laminate 200, having a structure in which a plurality of semiconductor layers are laminated, may be formed on the support substrate 100. An exemplary structure and configuration of the light emitting laminate 200 are illustrated and described in detail in FIG. 3 and the corresponding description therefor, so detailed descriptions thereof will be omitted here.

In FIG. 7, a single light emitting laminate 200 provided on the support substrate 100 is illustrated, but the present disclosure is not limited thereto. For example, a plurality of light emitting laminates 200 may be provided, and in this case, the plurality of light emitting laminates 200 may be spaced apart from one another at certain intervals in horizontal and/or vertical directions so as to be arranged in a matrix.

The wall unit 300' may be formed on sloped lateral surfaces of the light emitting laminate 200 such that the wall unit 300' surrounds the circumference of a corresponding light emitting laminate 200. Thus, when the light emitting laminate 200 is viewed from above, unlike the exemplary embodiment illustrated in FIG. 2 in which the upper surface and the sloped lateral surfaces of the light emitting laminate 200 are visible, in the present embodiment, only the upper surface of the light emitting laminate 200 is visible while the sloped lateral surfaces are covered by the wall unit 300' so as to be invisible, and only an upper surface of the wall unit 300' is visible.

The wall unit 300' is formed to extend higher than the light emitting laminate 200, so that the upper surface of the wall unit 300' is positioned higher than that of the light emitting laminate 200. Accordingly, light emitted from a lateral side of the light emitting laminate 200 may be reflected by the wall unit 300', thereby preventing light leakage from the lateral side.

The wall unit 300' may be made of a resin in which at least one type of phosphor is dispersed. Also, the wall unit 300' may have a structure in which a powder, formed of a material such as $TiO_2$, Ag, or the like, is dispersed instead of phosphors.

Meanwhile, the wall unit 300' is formed on the lateral surfaces of the light emitting laminate 200 and surrounds the circumference of the light emitting laminate 200, so that the electrode pad 241 formed on the support substrate 100 may be disposed outside of the wall unit 300', similarly to the exemplary embodiment illustrated in FIGS. 1 and 2.

However, in the embodiment of FIG. 2, the wall unit 300 is formed on the support substrate 100 and spaced apart from the light emitting laminate 200 by a predetermined interval. By comparison, in the present embodiment, the wall unit 300' may be in direct contact with the lateral surfaces of the light emitting laminate 200, effecting a structure more appropriate for a smaller light emitting device.

The wavelength conversion layer 400 may be fixedly attached to the wall unit 300' such that the wavelength conversion layer 400 covers the light emitting laminate 200. When the light emitting device 10' is viewed from above, the wavelength conversion layer 400 may have a shape corresponding to the light emitting laminate 200. Since the wavelength conversion layer 400 is not disposed on an upper portion of the electrode pad 241 disposed outside of the wall unit 300', the electrode pad 241 is not covered by the wavelength conversion layer 400. Thus, without being interfered with by the wavelength conversion layer 400, the electrode pad 241 may be bonded to a wire W so as to be electrically connected to an external power source, e.g., a lead frame or the like, on which the light emitting device 10' is to be mounted.

A configuration of the wavelength conversion layer 400 in the present embodiment may be substantially similar to that of the exemplary embodiment illustrated in FIG. 1, so that a detailed description thereof will be omitted.

A method for manufacturing a light emitting device according to the present embodiment will be described with reference to FIGS. 8A through 8I. FIGS. 8A through 8I are views schematically illustrating a sequential process of a method for manufacturing the light emitting device of FIG. 7 according to another exemplary embodiment of the present disclosure.

Figure 8A:
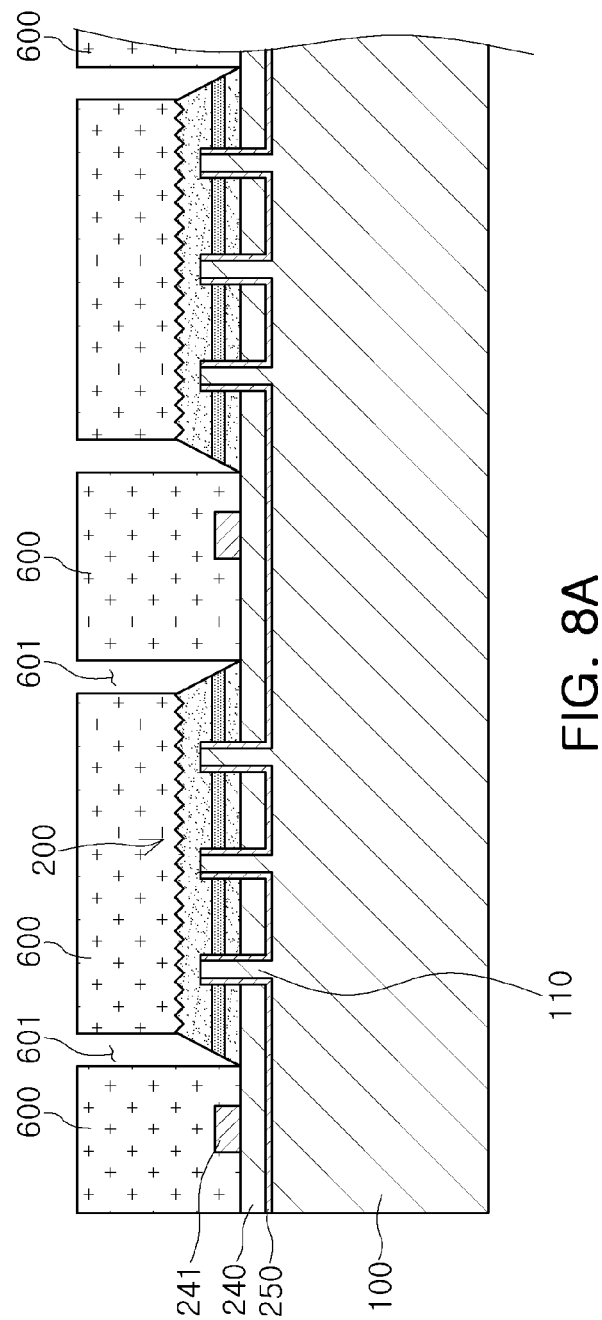

First, as illustrated in FIG. 8A, a support substrate 100 with the light emitting laminate 200 formed on one surface thereof is prepared. A plurality of light emitting laminates 200 may be spaced apart from one another at certain intervals in horizontal and/or vertical directions so as to be arranged in a matrix on the support substrate 100.

The support substrate 100 may be made of silicon-aluminum (Si—Al) (i.e., a combination of silicon (Si) and aluminum (Al)) so as to have conductivity. A conductive contact layer 240 may be formed on the support substrate 100.

A portion of the conductive contact layer 240 may be exposed to the outside, and the electrode pad 241 for applying an electrical signal may be formed on the exposed portion of the conductive contact layer 240. The conductive contact layer 240 is electrically separated from the support substrate 100 by an insulator 250 which may be interposed between the conductive contact layer 240 and the support substrate 100.

The light emitting laminate 200 may have a structure in which a plurality of semiconductor layers are laminated. The light emitting laminate 200 may include the first conductivity-type semiconductor layer 210, the active layer 220, and the second conductivity-type semiconductor layer 230.

The conductive support substrate 100 may be electrically connected to the second conductivity-type semiconductor layer 230 through the conductive via 110 penetrating the active layer 220, the first conductivity-type semiconductor layer 210, and the conductive contact layer 240. Accordingly, an electrical signal may be applied to the second conductivity-type semiconductor layer 230 through the support substrate 100. In this case, the insulator 250 may be formed between the conductive via 110 and the active layer 220, the first conductivity-type semiconductor layer 210, and the conductive contact layer 240.

An exemplary structure of the light emitting laminate 200 and the support substrate 100 is substantially similar to that illustrated in FIG. 3, so that a detailed description thereof will be omitted.

As shown in FIG. 8A, photoresist patterns 600 are formed on the support substrate 100 such that the photoresist patterns 600 cover upper surfaces of the electrode pads 241 and light emitting laminates 200.

The photoresist patterns 600 may be formed to partially cover upper surfaces of the light emitting laminates 200 and upper surfaces of the substrate 100, such that the sloped lateral surfaces of the light emitting laminates 200 are not covered. In this case, spaces 601 between the photoresist patterns 600, in which the sloped lateral surfaces of the light emitting laminates 200 are exposed, may have a shape corresponding to the wall unit 300'. Thus, the photoresist patterns 600 may serve as a type of mold.

The photoresist patterns 600 may be formed through a method such as screen printing, or the like.

Figure 8B:
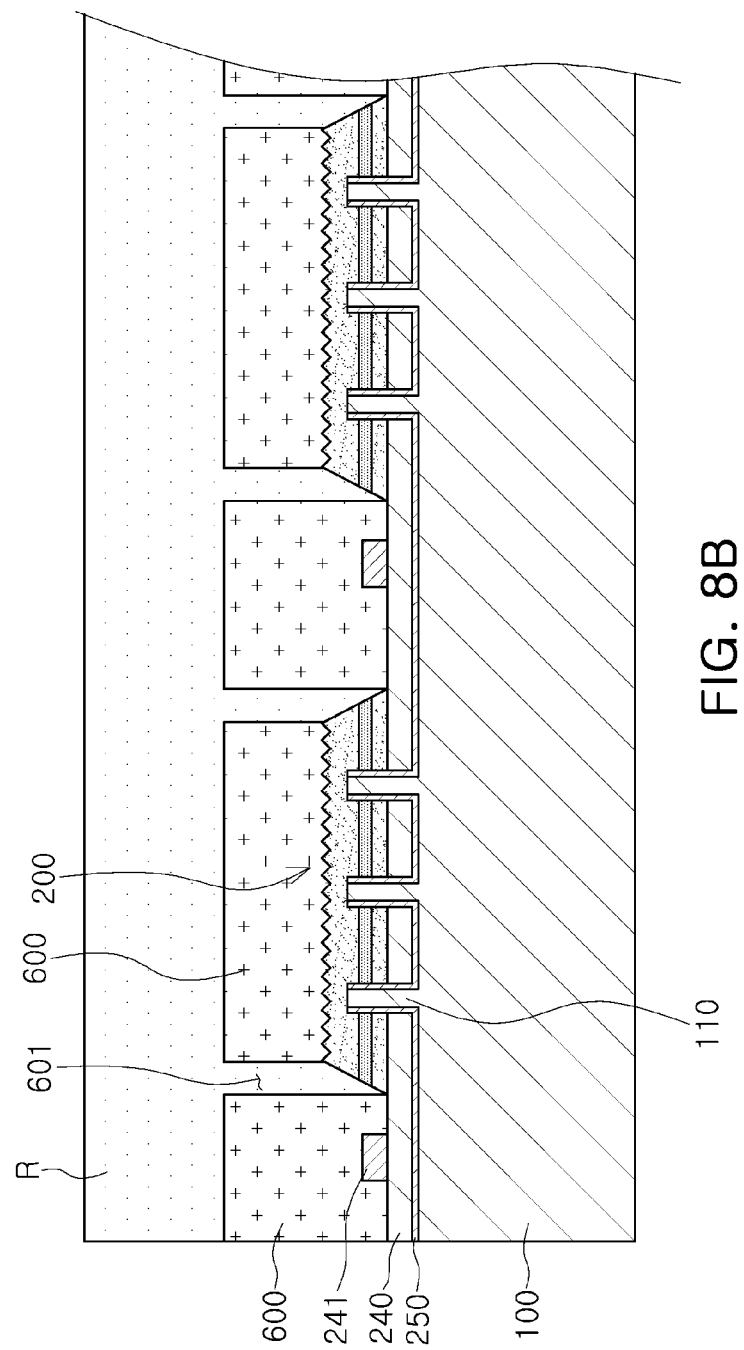

Thereafter, as illustrated in FIG. 8B, a resin R is dispensed on the support substrate 100 having the light emitting laminates 200 formed thereon. The resin R entirely covers the upper surface of the support substrate 100 including the photoresist patterns 600 and the light emitting laminates 200 such that the resin R fills the spaces 601 between the photoresist patterns 600. Accordingly, the sloped lateral surfaces of the light emitting laminate 200 are covered by the resin R. The resin R may be cured through an additional process.

At least one type of phosphor may be contained in the resin R in a dispersed manner. Also, the resin R may contain $TiO_2$, Ag powder, or the like.

Figure 8C:
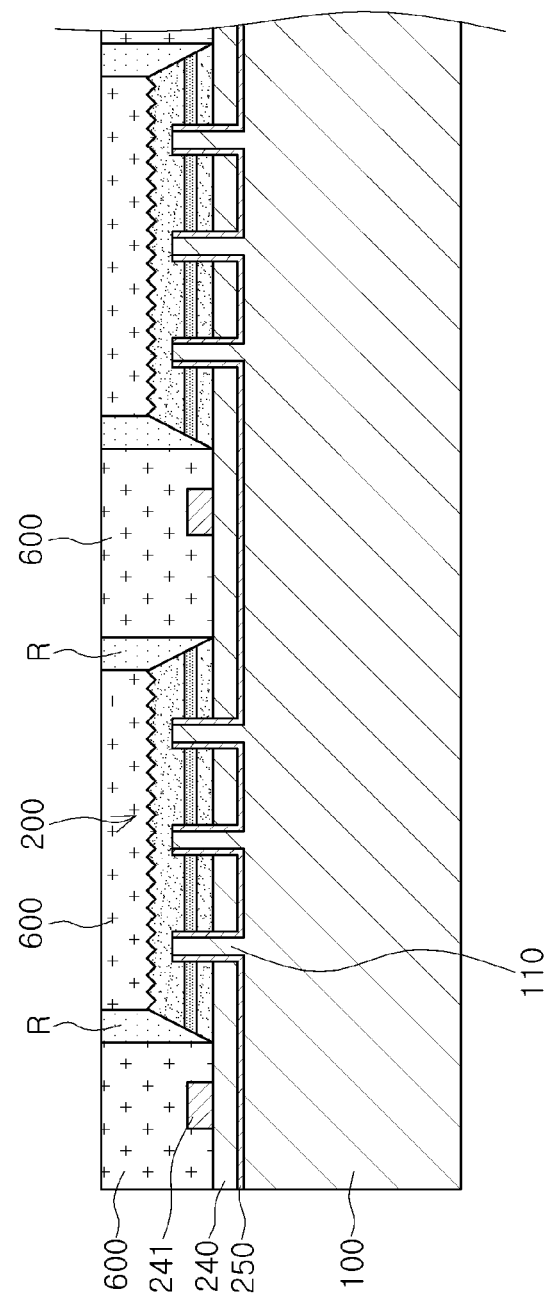

Thereafter, as illustrated in FIG. 8C, planarization is performed by removing portions of the cured resin R and the photoresist patterns 600 to obtain an overall flat and even upper surface.

Figure 8D:
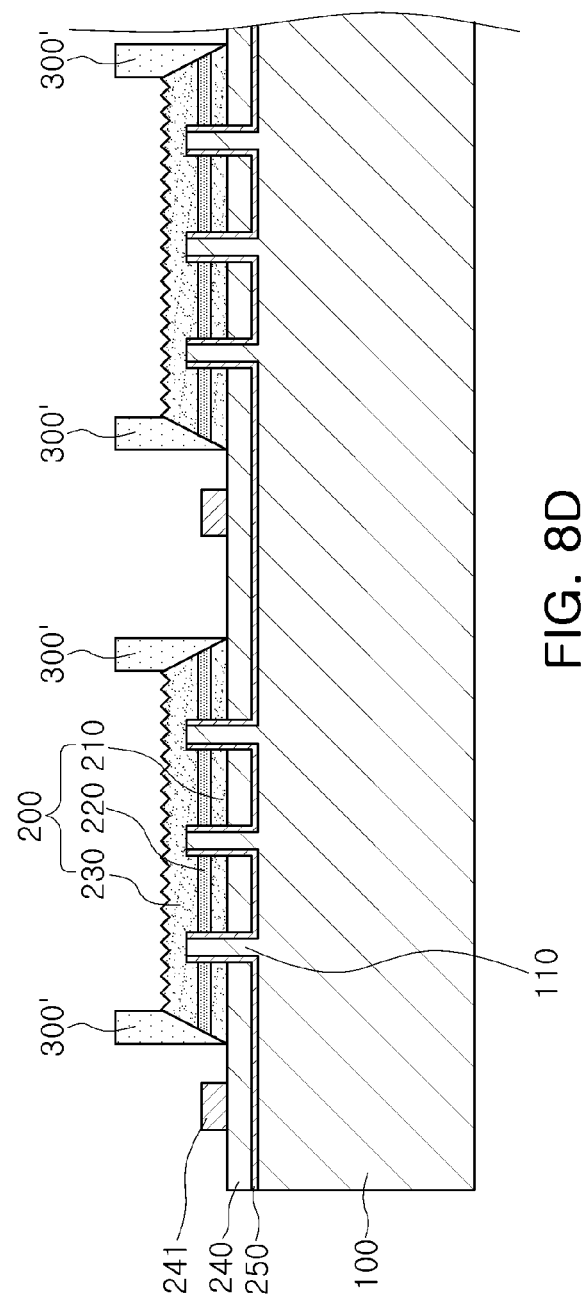

Thereafter, as illustrated in FIG. 8D, the photoresist patterns 600 are removed to form the wall units 300' on the sloped lateral surfaces of the light emitting laminate 200. The wall units 300' are formed by curing the resin R filling the spaces 601 between the photoresist patterns 600, and when the photoresist patterns 600 are removed, the wall units 300' protruding from the side walls may be exposed.

Figure 8F:
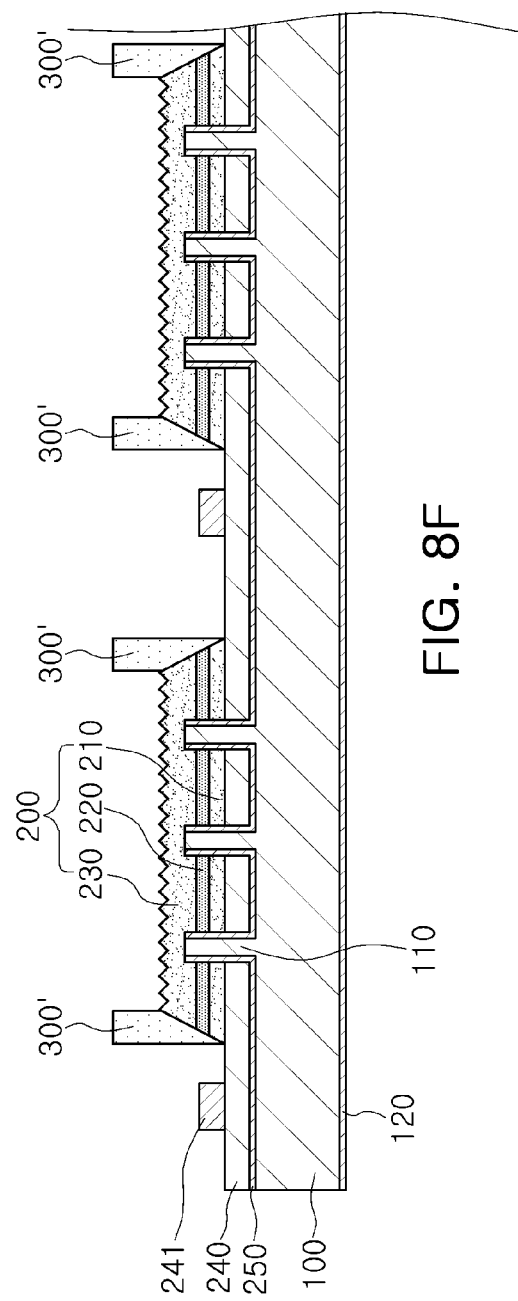

Thereafter, as illustrated in FIG. 8E, a portion of the support substrate 100 is ground from an opposite surface so as to be partially removed, and the metal layer 120 is formed on the resulting opposite surface of the support substrate 100 as illustrated in FIG. 8F. The metal layer 120 may apply an electrical signal, like the electrode pad 241 formed on the support substrate 100. The metal layer 120 may correspond to a different type of electrode pad having a polarity different from that of the electrode pad 241.

Figure 8G:
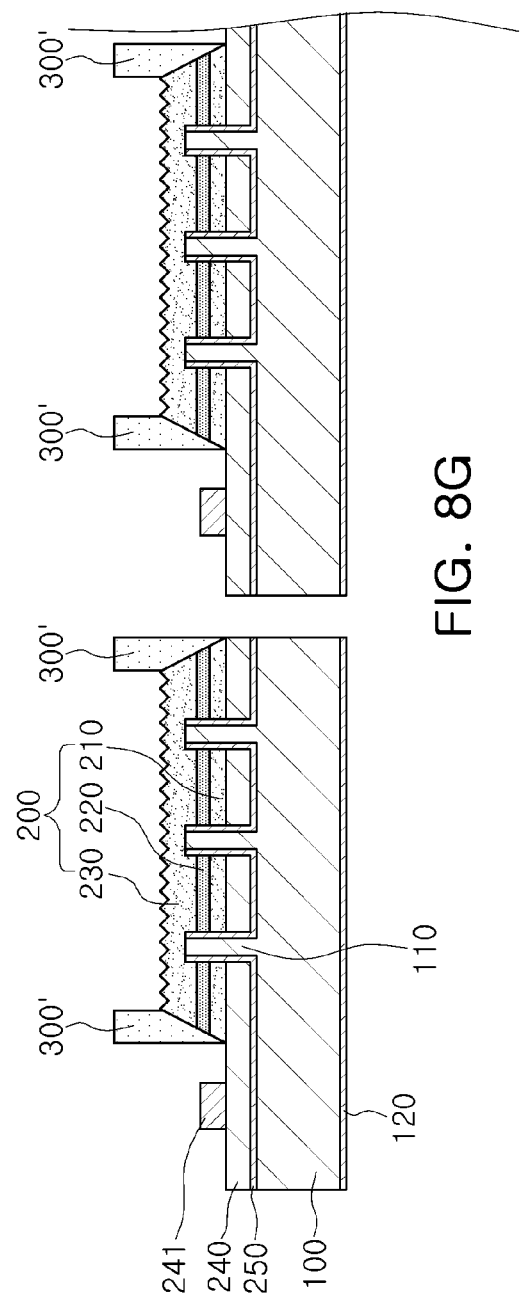
Figure 8H:
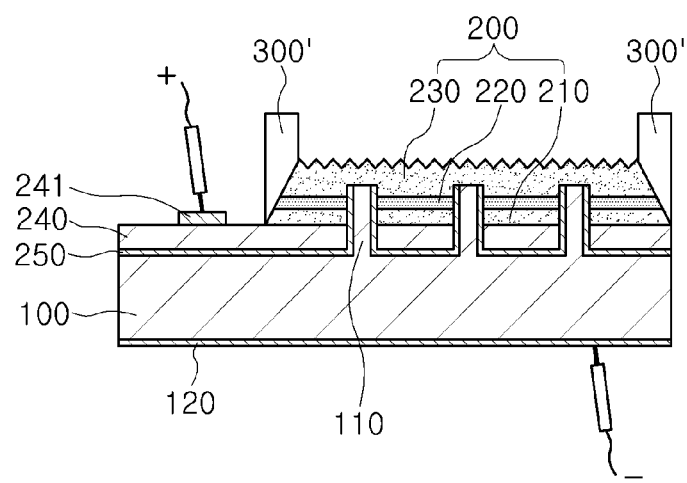

Thereafter, as illustrated in FIG. 8G, the respective light emitting laminates 200 are singulated (or cut) into individual light emitting devices through a dicing process. Thereafter, as illustrated in FIG. 8H, power is applied to the respective light emitting devices to measure light emitting characteristics (e.g., luminescence properties or emission characteristics) thereof. The light emitting devices are then sorted according to the measured light emitting characteristics.

Figure 8I:
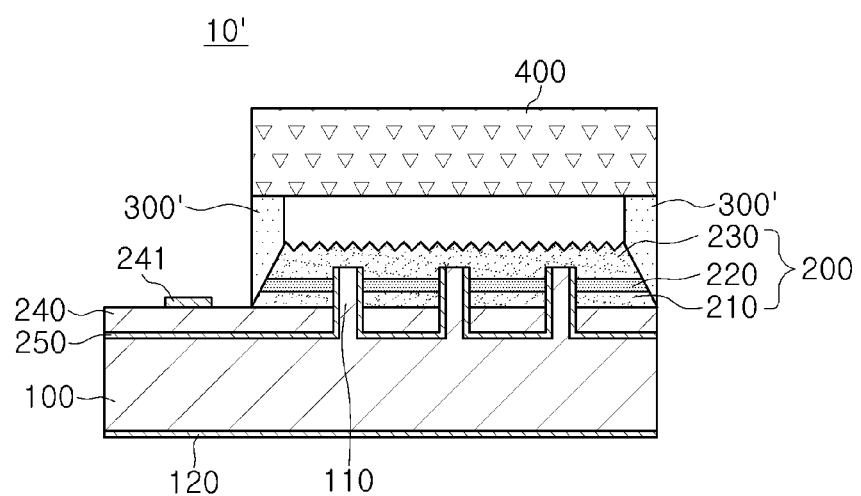

Thereafter, as illustrated in FIG. 8I, the wavelength conversion layer 400 is attached to the light emitting device to complete the light emitting device 10'. The wavelength conversion layers 400 may be fixedly attached to the wall units 300' of the respective light emitting laminates 200 and not disposed on upper portions of the electrode pads 241 disposed outside of the wall units 300', and thus, the electrode pads 241 are not covered by the wavelength conversion layers 400.

As the wavelength conversion layer 400, a wavelength conversion layer having wavelength conversion characteristics adjusted such that color distribution is minimized in consideration of the light emitting characteristics of the corresponding light emitting devices, specifically, the respective light emitting laminates 200, may be employed. The wavelength conversion characteristics of each wavelength conversion layer 400 may be adjusted by differentiating the types of phosphors contained in each wavelength conversion layer 400, by differentiating the amount of phosphors contained in each wavelength conversion layer 400, by differentiating a thickness of each wavelength conversion layer 400, or the like. Thus, color distribution of the completed light emitting devices can be adjusted to the MacAdam variance ellipse 3 step level.

Figure 9:
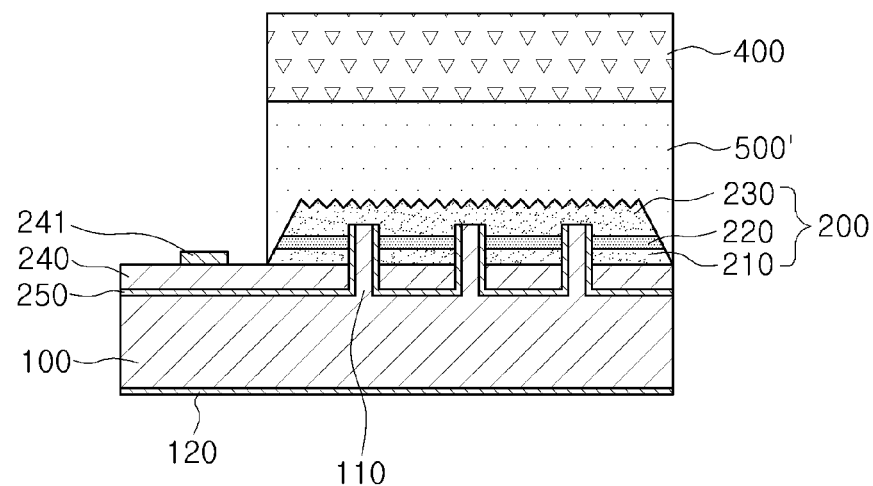
FIG. 9 is a cross-sectional view schematically illustrating a light emitting device according to another exemplary embodiment of the present disclosure.

FIG. 9 is a cross-sectional view schematically illustrating a light emitting device according to another exemplary embodiment of the present disclosure. Components constituting the light emitting device and a basic structure thereof according to the exemplary embodiment illustrated in FIG. 9 are substantially similar to those of the exemplary embodiment illustrated in FIG. 7, except for the structure of the wall unit. Thus, descriptions of the same components and structure as those of the foregoing embodiment will be omitted and a variation of the wall unit will be mainly described.

FIG. 9 is a cross-sectional view schematically illustrating a light emitting device according to another exemplary embodiment of the present disclosure. Referring to FIG. 9, the light emitting device may include the support substrate 100, the light emitting laminate 200, a molding part 500', and the wavelength conversion layer 400.

The support substrate 100, which serves as a support (or a prop) for the light emitting laminate 200 formed thereon, may be made of, for example, copper (Cu) or silicon-aluminum (Si—Al) (i.e., a combination of silicon (Si) and aluminum (Al)) having conductivity. The metal layer 120 may be disposed on a lower surface of the support substrate 100 and electrically connected to the support substrate 100.

The light emitting laminate 200, having a structure in which a plurality of semiconductor layers are laminated, may be formed on the support substrate 100. An exemplary structure and configuration of the light emitting laminate 200 are illustrated and described in detail in FIG. 3 and the corresponding description therefor, so detailed descriptions thereof will be omitted here.

The molding part 500' may be formed on the sloped lateral surfaces and upper surface of the light emitting laminate 200 so as to encapsulate the light emitting laminate 200. Thus, when the light emitting laminate 200 is viewed from above, unlike the exemplary embodiment illustrated in FIG. 2 in which the upper surface and the sloped lateral surfaces of the light emitting laminate 200 are visible and unlike the exemplary embodiment illustrated in FIG. 7 in which only the upper surface of the light emitting laminate 200 is visible, in the present embodiment, the surface of the light emitting laminate 200 is covered by the molding part 500' so as to be invisible, and only an upper surface of the molding part 500' may be visible. Accordingly, light emitted from the lateral side of the light emitting laminate 200 may be reflected by the molding part 500', thereby preventing light leakage from the lateral side.

Like the wall unit 300', the molding part 500' may be made of a resin in which at least one type of phosphor is dispersed. Also, the molding part 500' may have a structure in which a powder, formed of a material such as $TiO_2$, Ag, or the like, is dispersed instead of phosphors.

Meanwhile, the molding part 500' surrounds the circumference of the light emitting laminate 200 so that similar to the embodiments illustrated in FIGS. 2 and 7, the electrode pad 241 formed on the support substrate 100 may be disposed outside the molding part 500', rather than being covered by the molding part 500'.

Also, in comparison to the embodiment of FIG. 7 in which the wall unit 300' covers only the lateral surfaces of the light emitting laminate 200, in the present embodiment, the molding part 500' covers both the upper surface of the light emitting laminate 200 and the lateral surfaces of the light emitting laminate 200. However, the overall structures of both embodiments are substantially similar, and like the embodiment of FIG. 7, advantageously, the light emitting device according to the present embodiment can be reduced in size.

The wavelength conversion layer 400 may be fixedly attached to the molding part 500' such that the wavelength conversion layer 400 covers the light emitting laminate 200. When the light emitting device 10" is viewed from above, the wavelength conversion layer 400 may have a shape corresponding to the light emitting laminate 200. Since the wavelength conversion layer 400 is not disposed on an upper portion of the electrode pad 241 disposed outside of the molding part 500', the electrode pad 241 is not covered by the wavelength conversion layer 400. Thus, without being interfered with by the wavelength conversion layer 400, the electrode pad 241 may be bonded to a wire W so as to be electrically connected to an external power source, e.g., a lead frame or the like, on which the light emitting device 10" is to be mounted.

A configuration of the wavelength conversion layer 400 in the present embodiment may be substantially similar to that of the exemplary embodiment illustrated in FIG. 1, so that a detailed description thereof will be omitted.

A method for manufacturing a light emitting device according to the present embodiment will be described with reference to FIGS. 10A through 10I. FIGS. 10A through 10I are views schematically illustrating a sequential process of a method for manufacturing the light emitting device of FIG. 9 according to another exemplary embodiment of the present disclosure.

Figure 10A:
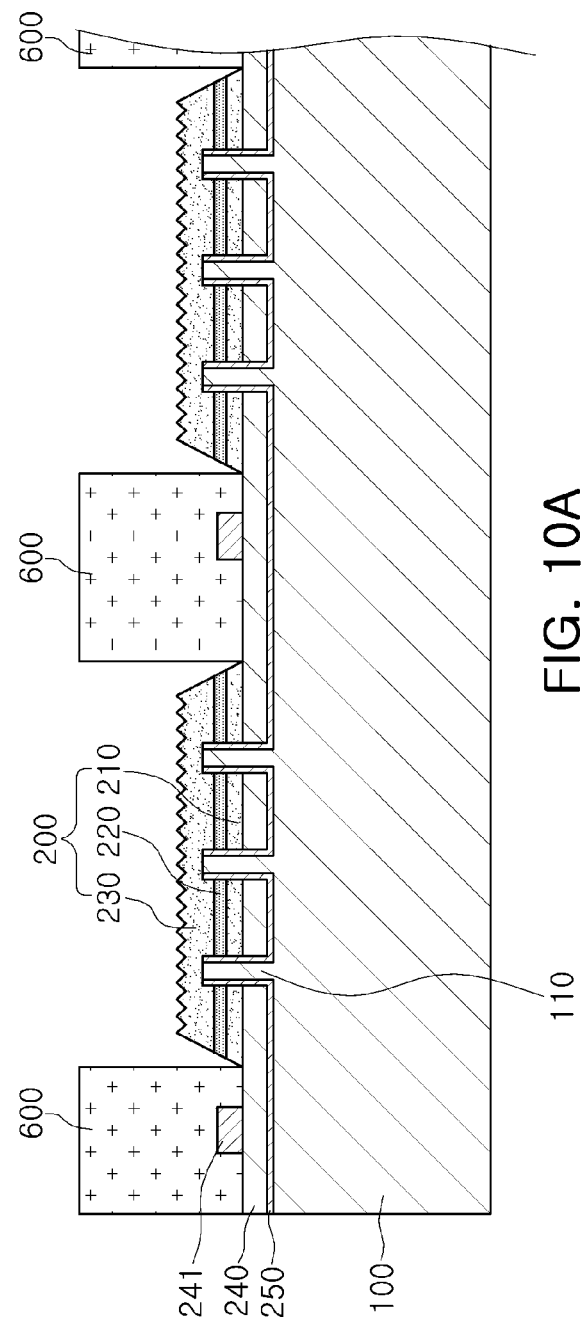

First, as illustrated in FIG. 10A, a support substrate 100 with the light emitting laminate 200 formed on one surface thereof is prepared. A plurality of light emitting laminates 200 may be spaced apart from one another in horizontal and/or vertical directions with a certain interval therebetween, so as to be arranged on the support substrate 100 in a matrix.

An exemplary structure of the light emitting laminate 200 and the support substrate 100 is substantially similar to those illustrated in FIGS. 3 and 7, so that a detailed description thereof will be omitted here.

As shown in FIG. 10A, photoresist patterns 600 are formed on the support substrate 100 such that the photoresist patterns 600 cover upper surfaces of the electrode pads 241. The photoresist patterns 600 may be formed to partially cover the upper surface of the support substrate 100, such that the sloped lateral surfaces and the upper surfaces of the light emitting laminates 200 are not covered. Namely, unlike the embodiment of FIG. 7 in which the photoresist patterns 600 are formed on the upper surfaces of the light emitting laminate 200, in the present embodiment, the photoresist patterns 600 are not formed on the upper surfaces of the light emitting laminates 200.

Figure 10B:
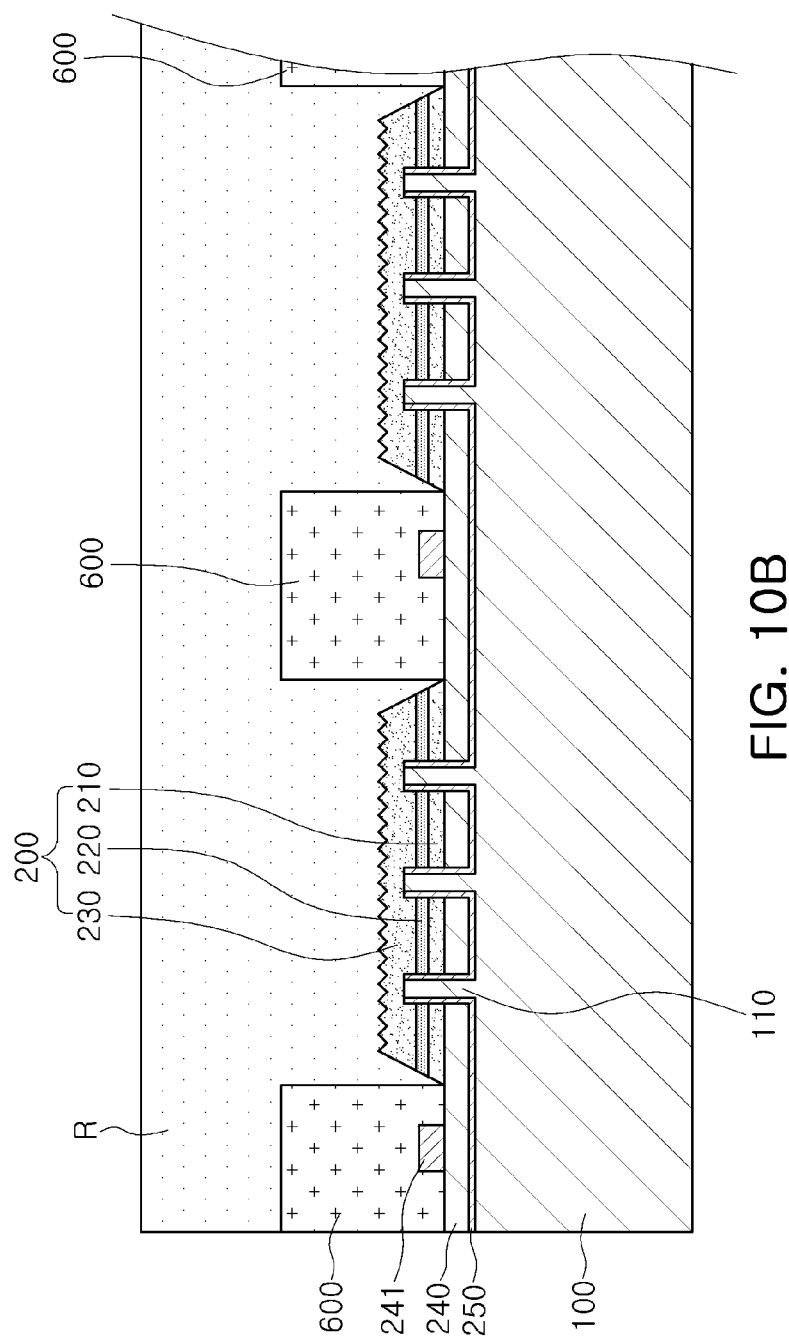

Thereafter, as illustrated in FIG. 10B, a resin R is dispensed on the support substrate 100 having the light emitting laminates 200 formed thereon. to the resin R entirely covers the upper surface of the support substrate 100 including the photoresist patterns 600 and the light emitting laminates 200 such that the resin R fills the spaces between the photoresist patterns 600. Accordingly, the sloped lateral surfaces and the upper surfaces of the light emitting laminate 200 are covered by the resin R. The resin R may be cured through an additional process.

At least one type of phosphor may be contained in the resin R in a dispersed manner. Also, the resin R may contain $TiO_2$, Ag powder, or the like.

Figure 10C:
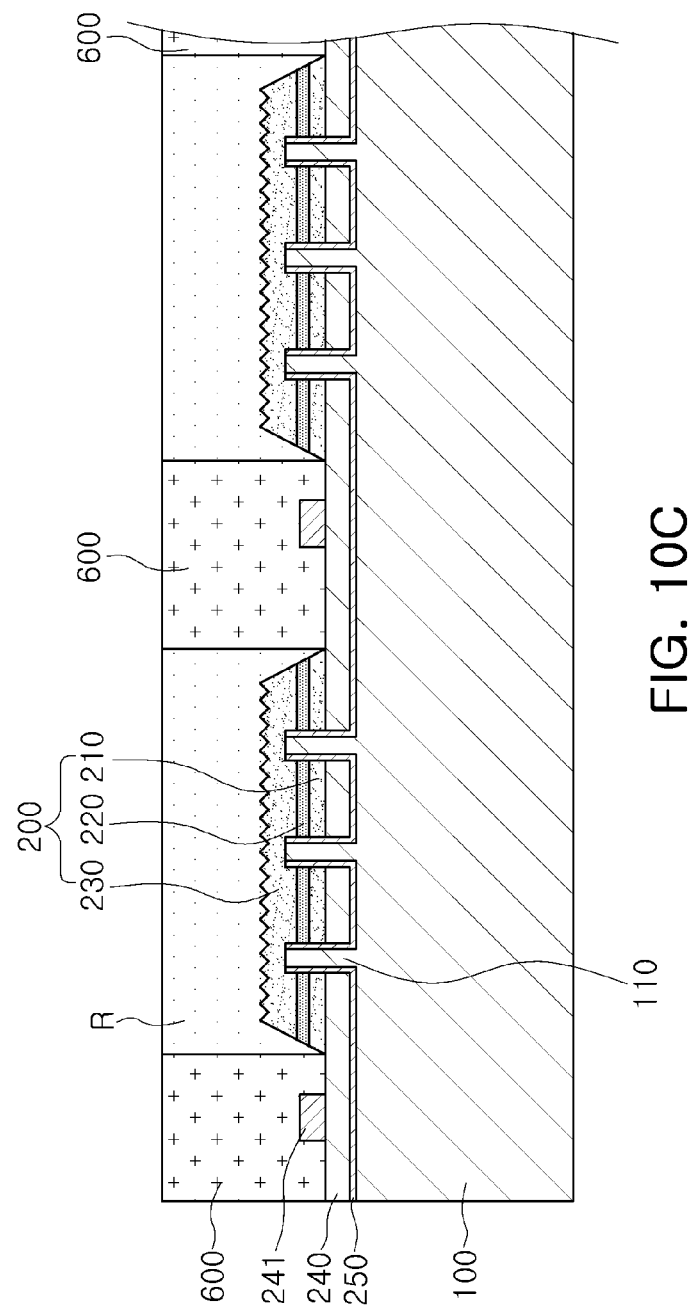

Thereafter, as illustrated in FIG. 10C, planarization is performed by removing portions of the cured resin R and the photoresist pattern 600 to obtain an overall flat and even upper surface.

Figure 10D:
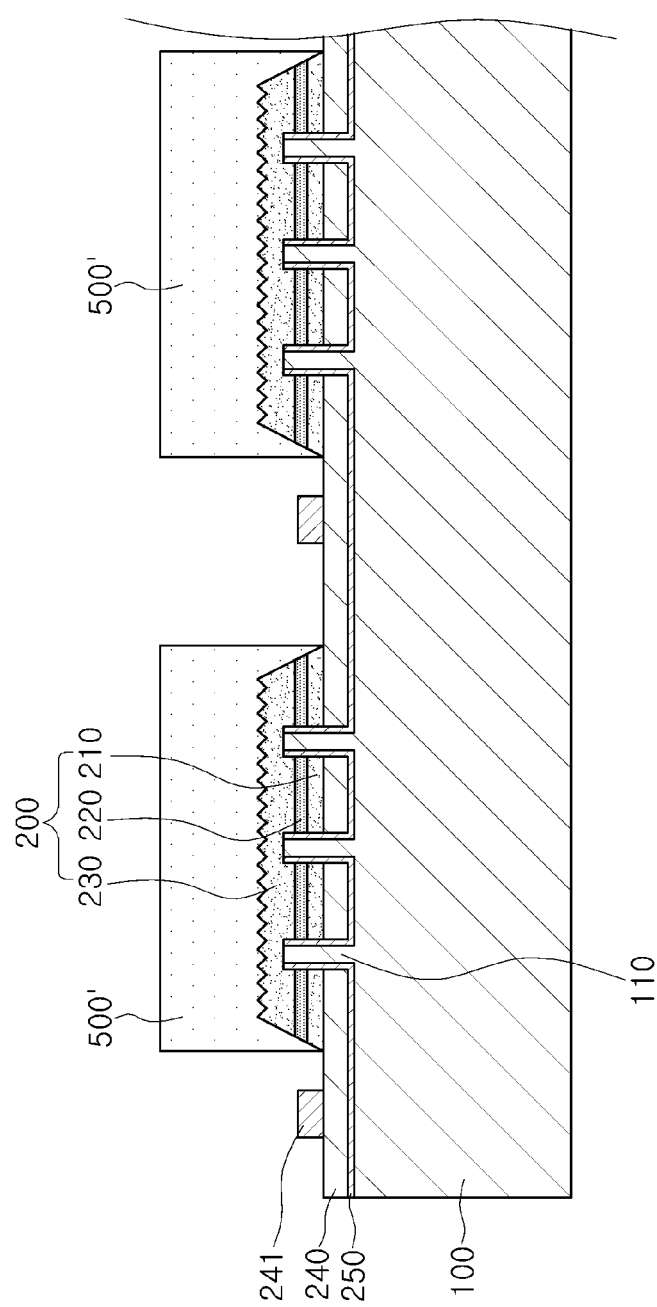

Thereafter, as illustrated in FIG. 10D, the photoresist patterns 600 are removed to form the molding parts 500' encapsulating the sloped lateral surfaces and upper surfaces of the light emitting laminates 200. The molding parts 500' are formed by curing the resin R filling the spaces between the photoresist patterns 600, and when the photoresist patterns 600 are removed, the molding parts 500' encapsulating the lateral and upper surfaces of the light emitting laminates 200 may be exposed.

Figure 10E:
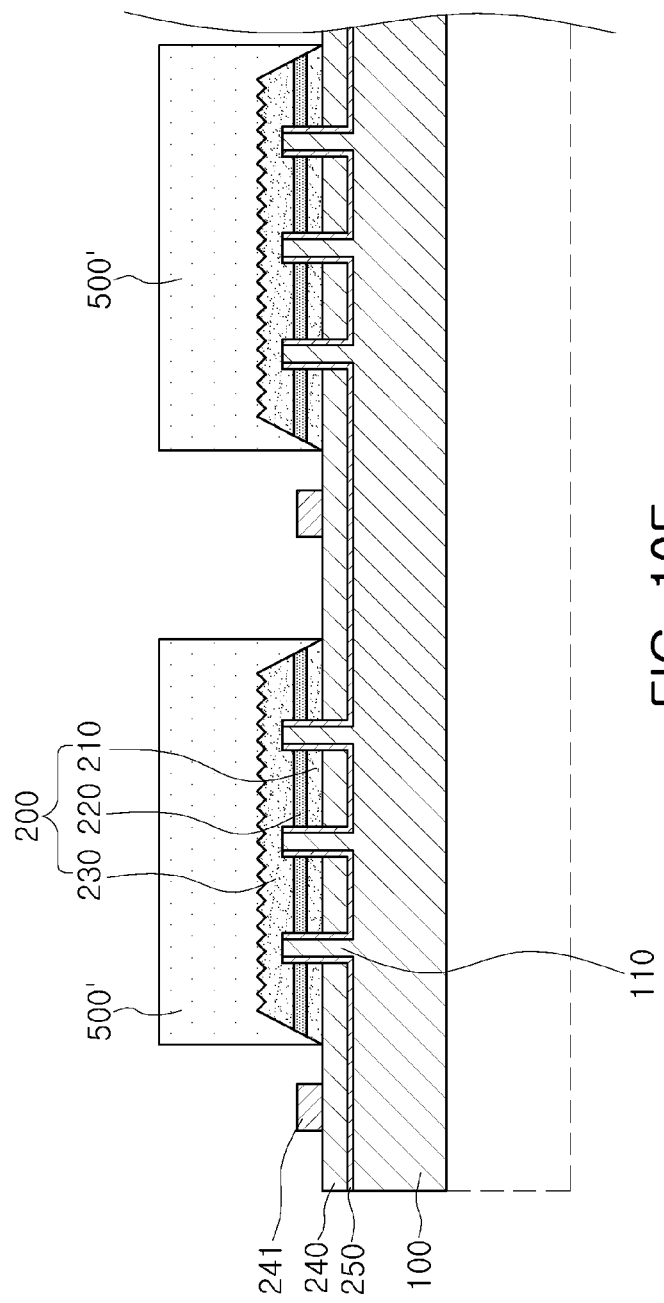

Thereafter, as illustrated in FIG. 10E, a portion of the support substrate 100 is ground from an opposite surface so as to be partially removed, and the metal layer 120 is formed on the resulting opposite surface of the support substrate 100 as illustrated in FIG. 10F. The metal layer 120 may apply an electrical signal, like the electrode pad 241 formed on the support substrate 100. The metal layer 120 may correspond to a different type of electrode pad having a polarity different from that of the electrode pad 241.

Figure 10H:
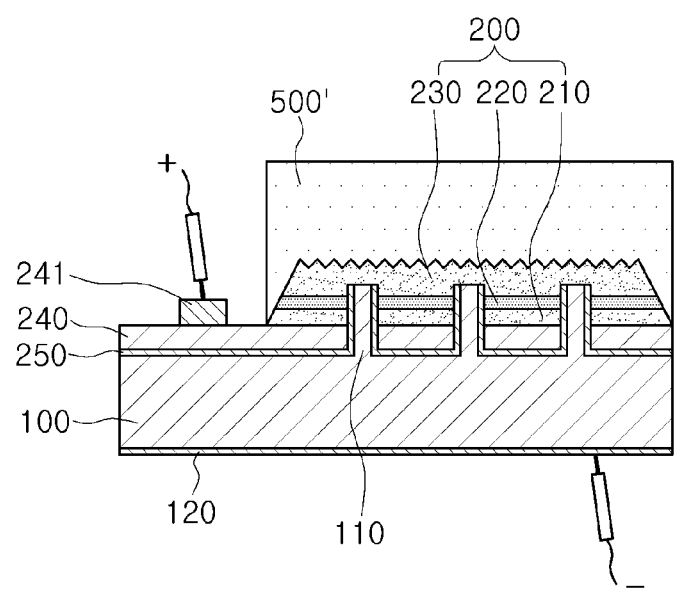

Thereafter, as illustrated in FIG. 10G, the respective light emitting laminates 200 are singulated (or cut) into individual light emitting devices through a dicing process. Thereafter, as illustrated in FIG. 10H, power is applied to the respective light emitting devices to measure light emitting characteristics(e.g., luminescence properties or emission characteristics) thereof. The light emitting devices are then sorted according to the measured light emitting characteristics.

Figure 10I:
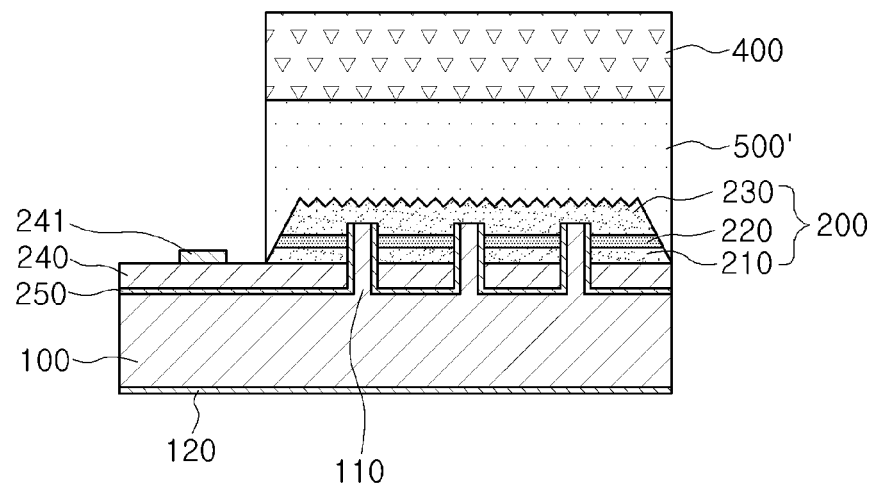

Thereafter, as illustrated in FIG. 10I, the wavelength conversion layer 400 is attached to the light emitting device to complete the light emitting device 10". The wavelength conversion layers 400 may be fixedly attached to the molding parts 500' of the respective light emitting laminates 200 and not disposed on upper portions of the electrode pads 241 disposed outside of the molding parts 500', and thus, the electrode pads 241 are not covered by the wavelength conversion layers 400.

As the wavelength conversion layer 400, a wavelength conversion layer having wavelength conversion characteristics adjusted such that color distribution is minimized in consideration of the light emitting characteristics of the corresponding light emitting devices, specifically, the respective light emitting laminates 200, may be employed. The wavelength conversion characteristics of each wavelength conversion layer 400 may be adjusted by differentiating the types of phosphors contained in each wavelength conversion layer 400, by differentiating the amount of phosphors contained in each wavelength conversion layer 400, by differentiating a thickness of each wavelength conversion layer 400, or the like. Thus, color distribution of the completed light emitting devices can be adjusted to the MacAdam variance ellipse 3 step level.

The light emitting device manufactured thusly may be used as a light source of a lighting device such as, for example, an MR16 lamp, a vehicle head lamp, or the like.

As set forth above, according to exemplary embodiments of the present disclosure, a light emitting device can be provided in which generation of a lateral light leakage can be prevented even if the wavelength conversion layer for converting a wavelength of light is provided above the light emitting device, and color distribution can be reduced by adjusting wavelength conversion characteristics in consideration of light characteristics of the light emitting device.

Various features and advantages of the present disclosure are not limited to the foregoing content and may be easily understood in the process of describing detailed embodiments of the present disclosure.

While the present disclosure has been shown and described in connection with the exemplary embodiments, it will be apparent to those having ordinary skill in the art that modifications and variations can be made without departing from the spirit and scope of the present disclosure as defined by the appended claims.

What is claimed is:
1. A light emitting device comprising:
  a support substrate;
  at least one light emitting laminate formed on the support substrate, the at least one light emitting laminate has a structure in which a first conductivity-type semiconductor layer, a second conductivity-type semiconductor layer, and an active layer interposed between the first and second conductivity-type semiconductor layers, are laminated;

a wall unit formed on the support substrate and surrounding the at least one light emitting laminate;

a wavelength conversion layer disposed above the at least one light emitting laminate;

an electrode pad formed on the support substrate and electrically connected to one of the first and second conductivity-type semiconductor layers; and a conductive via extending from the support substrate through the light emitting laminate so as to be electrically connected to the other one of the first and second conductivity-type semiconductor layers.

2. The light emitting device of claim 1, wherein the wall unit is formed to be higher than the at least one light emitting laminate such that an upper surface of the wall unit is positioned higher than an upper surface of the at least one light emitting laminate.

3. The light emitting device of claim 1, wherein the wall unit is made of a metal, and formed along a circumference of the at least one light emitting laminate.

4. The light emitting device of claim 1, wherein the at least one light emitting laminate includes plural light emitting laminates, and wherein the wall unit is formed between mutually adjacent light emitting laminates such that the mutually adjacent light emitting laminates are disposed on both sides of the wall unit, and the mutually adjacent light emitting laminates share the wall unit.

5. The light emitting device of claim 1, wherein the at least one light emitting laminate includes plural light emitting laminates, and wherein the wall unit surrounding any one side of one adjacent light emitting laminate is spaced apart from a different wall unit surrounding another adjacent light emitting laminate by a certain interval, such that the wall unit is not connected to the different wall unit.

6. The light emitting device of claim 1, wherein the electrode pad is disposed outside of the wall unit formed along the circumference of the light emitting laminate to inwardly surround the light emitting laminate.

7. The light emitting device of claim 6, wherein the electrode pad is not covered by the wavelength conversion layer.

8. The light emitting device of claim 1, wherein the wavelength conversion layer has wavelength conversion characteristics adjusted to have color distribution minimized in consideration of light emitting characteristics of a corresponding light emitting laminate.

9. The light emitting device of claim 8, wherein the wavelength conversion characteristics of the wavelength conversion layer are adjusted by differentiating types of phosphors or the content of phosphors contained therein.

10. The light emitting device of claim 1, wherein the wavelength conversion layer is fixedly attached to the wall unit.

11. The light emitting device of claim 1, wherein the support substrate is made of a material having conductivity.

12. The light emitting device of claim 1, further comprising a molding part disposed in the wall unit to cover the light emitting laminate.

13. A light emitting device comprising:

a support substrate;

a light emitting layer formed on the support substrate; and a conductive via extending from the support substrate through the light emitting layer.

14. The light emitting device of claim 13, wherein depressions and protrusions are formed on an upper surface of the light emitting layer.

15. The light emitting device of claim 13, wherein the light emitting layer includes a first conductivity-type semiconductor layer, a second conductivity-type semiconductor layer, and an active layer interposed between the first and second conductivity-type semiconductor layers.

16. The light emitting device of claim 15, wherein the conductive via extends through the light emitting layer so as to be electrically connected to one of the first and second conductivity-type semiconductor layers, and electrically isolated from the active layer and the other one of the first and second conductivity-type semiconductor layers.

17. The light emitting device of claim 13, wherein a side surface of the light emitting layer forms an acute angle with a bottom surface of the light emitting layer.

18. The light emitting device of claim 13, further including a wall unit formed on the support substrate or on the light emitting layer and surrounding the light emitting layer.

19. The light emitting device of claim 13, further including a wavelength conversion layer disposed above the light emitting layer.

* * * * *